United States Patent
Kon

(10) Patent No.: US 6,249,838 B1
(45) Date of Patent: Jun. 19, 2001

(54) PHYSICAL MEDIUM INFORMATION IN FILE SYSTEM HEADER

(75) Inventor: Ronnie B. Kon, Los Gatos, CA (US)

(73) Assignee: Cisco Technology Inc., San Jose, CA (US)

( * ) Notice: Subject to any disclaimer, the term of this patent is extended or adjusted under 35 U.S.C. 154(b) by 0 days.

(21) Appl. No.: 09/221,035

(22) Filed: Dec. 28, 1998

(51) Int. Cl.[7] .............................. G06F 12/00; G11C 8/00
(52) U.S. Cl. .............. 711/103; 365/185.33; 365/230.03; 711/101; 711/102; 711/104
(58) Field of Search ........................ 711/4, 101, 102–106; 365/185.33, 230.03; 320/112

(56) References Cited

U.S. PATENT DOCUMENTS

| | | | |
|---|---|---|---|
| 5,115,182 | * 5/1992 | Ehmke et al. | 320/14 |
| 5,357,475 | 10/1994 | Hasbun et al. | 365/218 |
| 5,376,875 | * 12/1994 | Yee et al. | 320/21 |
| 5,437,020 | 7/1995 | Wells et al. | 714/6 |
| 5,471,478 | 11/1995 | Mangan et al. | 714/7 |
| 5,930,193 | * 7/1999 | Achiwa et al. | 365/230.03 |
| 5,953,737 | * 9/1999 | Estakhri et al. | 711/103 |
| 6,034,897 | * 3/2000 | Estakhri et al. | 365/185.33 |
| 6,072,299 | * 6/2000 | Kurle et al. | 320/112 |

* cited by examiner

Primary Examiner—Than Nguyen
(74) Attorney, Agent, or Firm—Sheridan Ross P.C.

(57) ABSTRACT

Data storage units, such as flash memory, nonvolatile random access memory and like, are provided with information stored therein, or physically coupled thereto, which indicates, or can be used to determine, remaining or impending end of lifetime of the data storage unit or its components. In a flash memory embodiment, a counter initialized to the number of maximum permissible flash memory erasures is stored in a counter, such as in the header portion of the flash memory. The counter is decremented with each erasure and, as the counter approaches zero, appropriate actions can be taken such as warning the user, support personnel, vendor and the like and/or disabling the flash memory.

19 Claims, 4 Drawing Sheets

PHYSICAL MEDIUM INFORMATION IN FILE SYSTEM HEADER

FIELD OF THE INVENTION

The present invention relates to the storage of information relating to a physical data storage medium indicative of its usage or design lifetime such that at least some of the information remains coupled to the medium such as storing, in a flash memory header, information relating to the number of flash memory erasures.

BACKGROUND OF THE INVENTION

A number of information storage media have a predeterminable or calculable design lifetime or maximum usage. An example is flash memory which typically can support a number of memory erasure operations (such as in the range of about $10^4$ through about $10^5$ erasures) but which can be expected to fail some time after that number of erasures. Accordingly, the expected design lifetime of a flash memory is more a function of the manner in which it is used (and particularly, its erasure frequency) than the mere passage of time. To achieve a degree of confidence in the continued operation of a system which includes flash memory, the flash memory should be replaced as the number of erasure operations performed using the flash memory approaches the expected design lifetime of the flash memory. Accordingly, it would be useful to provide a system in which replacement of the flash memory (or similar data storage medium) will be encouraged, requested, and/or required at an appropriate time.

Although it would be possible to provide a system for manually providing a reminder of the need for a media replacement (such as marking reminder on a calendar) there is a significant risk that this type of reminder would become unassociated with the data storage medium. For example, if the data storage medium is a medium which is a removable medium (moved from one computer or other device to another computer or other device, a manual calendar reminder, for example, may not properly reflect the appropriate replacement date for the particular medium which is currently inserted in a computer (or other device). Furthermore, a manual reminder such as a calendar entry may be infeasible when design lifetime is based, not on date of installation, but on information that may not be readily available for, e.g., manual entry on a calendar, such as date of manufacture of the medium. Furthermore, when design lifetime is determined or affected by factors other than mere passage of time (such as number of erasures or similar usage factors) tracking such use dependent factors can be burdensome or infeasible for a manual reminder system. Accordingly, it would be useful to provide a system in which accurate and current design lifetime information, based on appropriate criteria, remain coupled, preferably physically coupled, to the memory medium or device.

Although, in a number of computing contexts, it may be possible to configure a computer to provide, or assist in providing, appropriate media replacement reminders, it can be disadvantageous to impose additional computing burden or "overhead" on a CPU (Central Processing Unit) for tracking usage of each storage medium and it can be burdensome to impose a programming or data entry burden on programmers or users. Accordingly, it would be useful to provide a system for encouraging or assuring appropriate storage medium replacement without substantially incurring or increasing computing, programming or data entry burden.

The type of response which is most appropriate, as the end-of-design-lifetime approaches, will vary depending on such factors as the type of medium involved and type of computing system or computing network where the device is employed and/or user preferences. In especially critical computing environments, it may be undesirable to give a user an opportunity to ignore or override a warning or request that media replacement is due. Accordingly, it would be useful to provide a system in which the system can be configured so as to respond in different fashions to the detection of an approaching end-of-design-lifetime event.

SUMMARY OF THE INVENTION

The present invention provides for storing, and, as appropriate, updating or incrementing system or component information, such as remaining-expected-lifetime information, (or information from which remaining-expected-lifetime information can be determined or derived) (REL), in a fashion which remains associated with a data storage medium, and, in response, providing an appropriate output, warning or action. In various embodiments, the REL information may be stored using the same storage medium that is used for storing the data for which the data storage unit is intended ("main storage medium"), e.g., in the header portion or other portion of the memory array of a flash memory, nonvolatile random access memory (RAM) or other RAM, a header portion of disk storage in a fixed or hard disk drive (HDD) and the like. Alternatively, the REL information can be stored on a separate storage device such as providing an HDD storage unit with a small flash memory or other memory mounted on or otherwise coupled to the HDD unit. In either case, the memory device (or a portion of memory medium) used for storing at least a portion of the REL information is physically mounted on or otherwise physically coupled to the data storage unit to which the REL relates. In this context, a data storage unit to which the REL information relates is the unit which would normally be replaced at the end of the expected lifetime indicated by the REL information. For example, in the case of a flash memory device, the entire flash memory device would normally be replaced at the end of the expected lifetime of the flash memory. In contrast, a removable medium hard disk drive (RMHDD) may have an expected lifetime for the removable medium which is different from the expected lifetime of the drive mechanism. In this situation, if REL information relating to the removable medium is provided, preferably at least some of such REL information is stored in a device which stays with the removable medium when the medium is removed from the drive (e.g., so that even if the removable medium is inserted in a different drive, it is still possible to detect the appropriate remaining-expected-lifetime and to take the appropriate action. If REL information is provided in connection with the drive device for the RMHDD, it would generally be preferred to store at least a portion of the REL information related to the drive portion on the drive itself, (as opposed to on the removable medium) so that even if new removable media were inserted in the RMHDD, the appropriate REL information related to the RMHDD drive portion would be available. Furthermore, in this situation, if the drive portion of the RMHDD was replaced at the end of the expected lifetime of the drive portion, the replacement RMHDD would preferably contain REL information related to the replacement RMHDD. In this way the REL information is stored in a fashion such that the REL information moves with the data storage unit to which it relates, regardless of replacement of parts or media in the overall system.

The REL information can be used in a number of fashions. In one configuration, the CPU or similar central computing device can periodically read the REL information (in a "polling" fashion). Alternatively, the data storage unit can include logic which periodically or continuously monitors the REL information and sends an interrupt signal to the CPU when the remaining expected lifetime approaches (is within a relatively small distance from) an indication of zero remaining lifetime. The REL information stored on the data storage unit may be sufficient, in itself, to determine remaining expected lifetime (such as a counter in a flash memory holding the remaining expected available erasures) or may be information which is combined with information stored elsewhere in order to calculate, look up or otherwise determine remaining expected lifetime (such as a serial number or other identifier number stored in the data storage unit which is used to index into a data base of REL information stored elsewhere. In any case, once it is determined that the data storage unit is approaching the end of its expected life time, the information which is output (either in a polling fashion or an interrupt fashion) can be used to trigger one or more of a plurality of responses. In one embodiment, a CPU can be receive such an output and provide a display, printout, alarm or similar output (such as by a monitor, or other screen, printer, speaker and/or sound card and the like) to alert a user or administrator that the device needs replacing, maintenance attention and the like. Although its possible to provide the entire system (detection and output of warning) in the context of a single computer such as a personal computer (PC), work station or similar computer, it is also possible to provide the warning at a remote location such as a system administrator or technical support location, a computer or computer component manufacturer or vendor location and the like. It is also possible to configure the system to take different types of actions as the data storage unit gets closer and closer to the end of expected lifetime, such as first providing warnings to the user, then providing warnings to a system administrator and finally, preventing any further use, preventing any further writes, preventing further power-ups or similar action with regard to the storage unit, e.g. until replacement or maintenance has been performed.

DETAILED DESCRIPTION

Figure 1:
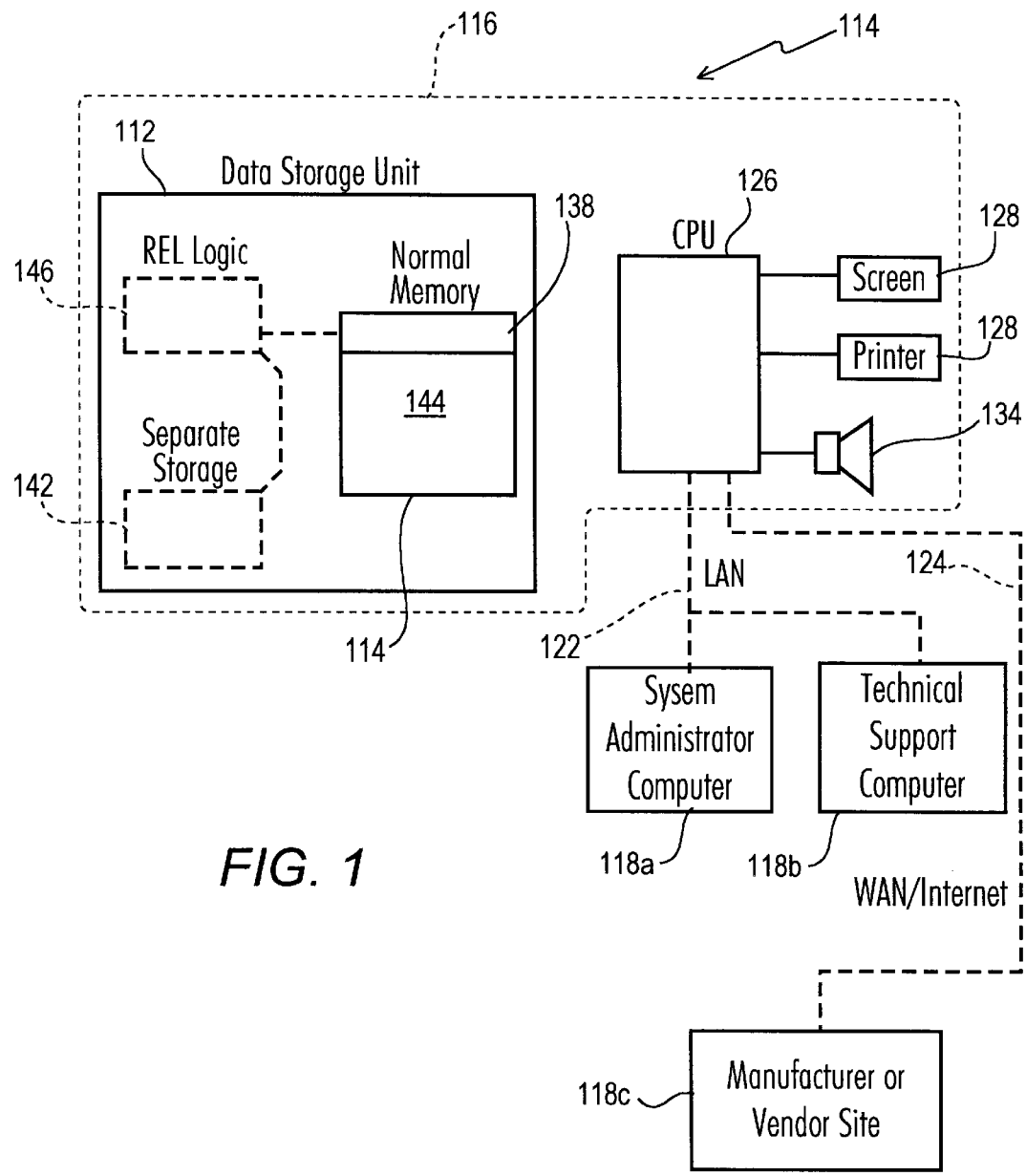
FIG. 1 is a block diagram of a computing system with a data storage unit which can store remaining expected lifetime information according to an embodiment of present invention.

As depicted in FIG. 1, a data storage unit 112 is commonly coupled to, or part of, a larger system 114 which may include, for example, other components of a computer (such as a personal computer, work station, laptop or palmtop computer, or telecommunications device such as routers, bridges and the like) 116 and, in some configurations, other computers or similar devices 118a, b, c, e.g. coupled by a local area network (LAN) 122, wide area network (WAN), Internet link 124, or by serial or dedicated point-to-point connections, and the like, or can be coupled to non-computer devices, such as televisions, stereo equipment, microwave ovens, and the like. As depicted in FIG. 1, the computer 116 includes the data storage unit 112 and typically contains components such as a CPU 126, CRT or LCD screen 128 or other video monitor, printer 132, audio speaker 134 and other components, as is well known in the art. The data storage unit 112, in the embodiment of FIG. 1, includes a normal or main memory area 114 for storing the data for which the data storage unit 112 is intended. For example, when the data storage unit is a flash memory, random access memory or the like, the normal memory 114 is an array of memory cells, and when the data storage unit 112 is a disk drive, the normal memory area 114 is one or more magnetic storage disks. Many types of normal memory 114 contain a portion 138 dedicated to storing system information (often in the extreme beginning or end regions of the normal memory 112) and often termed a "header" region. In some configurations the data storage unit 112 is self-contained in the sense that the data storage unit 112 is not normally removed from the computer 116, other than for replacement in case of failure or at the end of its design lifetime. In other situations, a data storage unit 112 may be configured to be normally removable from the computer, such as a disk unit which is removable in the context of a removable media hard disk drive. Although the embodiment of FIG. 1 shows the computer 116 with one data storage unit 112, computers may be provided with a plurality of data storage units and, in different configurations, none, some or all of the data storage units may be removable. When the computer 116 has more than one data storage unit, it is possible to use features of the present invention in connection with only one, some, or all of the data storage units in the computer.

In various embodiments of the present invention, remaining-expected-lifetime (REL) information is stored in a fashion that is physically coupled to the data storage unit such as by being stored in the normal memory 114 or in a separate storage device 142 which is physically coupled to the data storage unit 112. When a separate storage device is provided, a number of data storage devices can be used for this purpose including a separate flash memory, register, hardware counter, DRAM (dynamic random access memory), SRAM (static random access memory), EEPROMS (electronically erasable programmable read only memories), PAL (programmable array logic), or PGA (programmable gate arrays). It is possible to store REL information both in normal memory 114 and in a separate storage device 142, either in duplicate form or in such fashion that the REL information in normal memory 114 is different from at least some REL information stored in a separate storage device 142. When the REL information is stored in the normal memory 114, it may be stored in a header or other system area 138, in the non-header area 144 or in both areas (either in duplicate or distributive fashion). When a separate storage device 142 is provided, it may be used for storing only REL information or may be used for storing other information as well. As one example, a non-removable-medium hard disk drive may be provided with a small flash memory 142, mounted in the hard disk drive chassis (142) and the separate memory storage device 142 can be used to store, in addition to REL information (or in place of REL information) information which is used for operating or accessing data stored on the disk, such as so-called "super block" information, file access table (FAT) information and the like, in duplicate, exclusive or distributed fashion. Preferably, in such embodiment, information stored in the separate storage device 142 can be used to recover or access information stored in normal memory 114, even after a head crash or similar problem has destroyed an on-disk super-block, FAT or similar information.

A number of types of information can constitute, or form part of, REL information. The type of information that will be stored as REL information depends on factors such as the type and configuration of the storage medium (since flash memory lifetime may be based on number of erasures while nonvolatile memory lifetime may be based on e.g. battery usage), the procedures used for detecting impending end of design life (incrementation of a counter may be desired when the data storage unit contains within itself a direct indication of remaining lifetime while incrementation of REL data may be unnecessary if the REL data is, e.g., a serial number for indexing to a remote database) and the like. Preferably, REL information access procedures and formats are at least partially standardized so that computers or computing systems can make effective use of the REL information regardless of differing manufacturers, vendors, and the like. In one embodiment, two or more different standards are available and the data storage unit can output information indicating which standard is being used.

Although it is possible to use REL information stored on the data storage unit which, once stored, is not, thereafter, changed (such as a serial number), preferably, REL information stored on the data storage unit includes at least some information which is written or modified during the course of normal use of the data storage unit (such as a hardware or software counter which is decremented or incremented in response to usage events such as flash memory erasure and the like).

Reading some or all of the REL information or writing REL information can be performed using read/write logic which is located on (or coupled to) the data storage unit 146 or can be performed using logic which is located elsewhere, including performing reads or writes under direct control of the CPU 126. Providing separate read/write logic 146 (whether physically coupled to the data storage unit or located elsewhere) can be useful in avoiding imposing any additional computing or programming burden with respect to the CPU 126.

In one embodiment, the logic 146 which achieves reading and/or writing the REL information is substantially transparent in the sense that all or substantially all signals, interfaces, protocols and the like for operating the data storage unit will be identical for a data storage unit 112 which includes REL information storage according to the present invention compared to a data storage unit without this feature, such as a previously available data storage unit. For example, in one embodiment, the CPU 126 provides the same data, address and control signals to the data storage unit 112 of the present invention as would have been provided for a prior art data storage unit but the data storage unit 112 contains (or is physically or logically coupled to) logic circuitry which achieves the necessary reading or writing of REL information and outputs an interrupt to the CPU 126 when the remaining expected lifetime of the data storage unit 112 is approaching zero. In this configuration, the only modification to the computer 116 or system 114 needed for utilizing the REL information would be to provide procedures for responding to such an interrupt signal. For example, in one embodiment, the CPU 126 may be controlled by programs which provide that, in response to such an interrupt, the CPU 126 will control the screen 128, printer 132 and/or audio output 134 to provide a warning or alarm.

Such warnings can take a plurality of forms such as identifying the pertinent component and informing the user that the end of the expected component lifetime is approaching, providing an estimated remaining lifetime, preferably in chronologic form, instructing the user how to obtain replacement, instructing or suggesting to the user that data backup procedures should be performed, automatically performing data backup procedures, disabling further use of the component and the like.

When the system 114 includes other computers 118a, b, c or similar components, the CPU 126 may be configured to, output a message over a network, such as local network 122, wide area network or Internet connection 124. For example, information about an impending end-of-design-lifetime event can be automatically forwarded to a system administrator computer 118a or a technical support computer 118a so that the appropriate personnel can be notified that a identified component in an identified computer needs to be replaced or otherwise serviced. In one embodiment, in response to detection of an end-of-design-lifetime event, programming will control the CPU 126 to output a message to a manufacturer or vendor 118c, which may be the manufacturer or vendor which made or sold the about-to-expire data storage unit, and which can respond in any of a number of fashions, including sending an e-mail or other notice to the user about the impending end-of-design-lifetime event, provide a price quotation or offer for a replacement (or upgrade) device and/or installation, automatically (e.g. in accordance with a previous arrangement) ship a replacement unit or and/or schedule a replacement unit installation, preferably automatically billing or charging an appropriate account.

Figure 2:
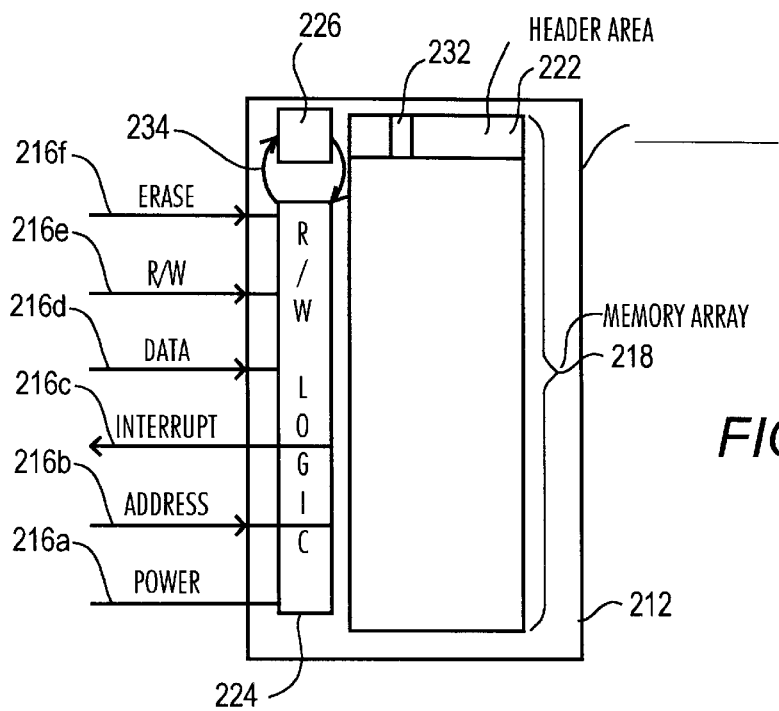
FIG. 2 is a block diagram of a flash memory device according to an embodiment of the present invention.

FIG. 2 depicts a flash memory that may be used in accordance with one embodiment of the present invention. In the embodiment of FIG. 2, a flash memory 212 is coupled, in a computer system, using a plurality of data lines or buses including, e.g. one or more power lines address line 216b and interrupt line 216c data lines 216d read/write or other control lines 216e and flash memory erase control line 216f. The flash memory 212 includes a normal or main memory area 218 comprising a plurality of memory cells, and having at least one header area 222. Memory control (read/write) circuitry 224 in response to, e.g., data address and control signals, performs memory operations such as memory reads, writes, and erase operations in a manner known to those of skill in the art. In the embodiment depicted in FIG. 2, REL logic (REL information read/write) circuitry 226 is provided on the flash memory 212. Although the REL logic 226 is depicted as being spaced from the flash memory read/write logic 224, it is possible to provide the logic circuitry for read/write and the logic circuitry for REL functions in the same area. One advantage of providing the REL logic, on the data storage unit is the assurance that counters and similar information will be properly updated (incremented, decremented and the like) regardless of what type of machine the flash memory is used in, i.e., the flash memory depicted in FIG. 2 is not restricted to use only in machines or computers that have been programmed to perform updates of the REL information.

Figure 3:
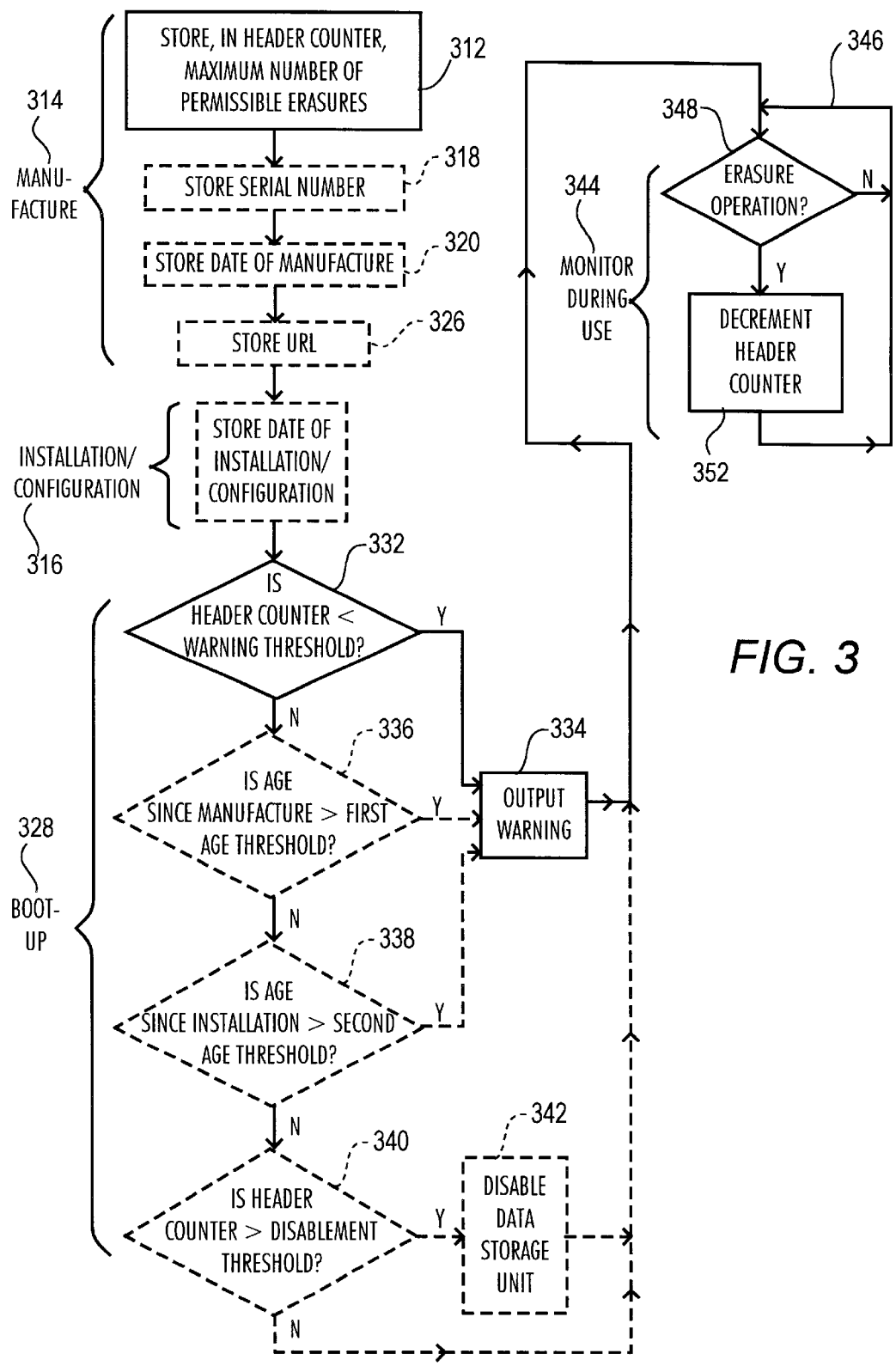
FIG. 3 is a flow chart of a procedure for providing and using remaining expected lifetime information according to an embodiment of the present invention.

As depicted in FIG. 3, in one embodiment, a counter 232 in a header area 222 has stored in it an initial value indicative of the maximum number of permissible erasures for the flash memory 212. In the depicted embodiment, the maximum is stored 312 during manufacture of the flash memory 314.

However, it is possible to provide embodiments in which REL information is initialized at other times, such as during installation or configuration 316 of the flash memory. In some situations it may be preferable to provide for storing or initializing at least some REL information other than by the manufacturer, such as when a system administrator may wish to provide for a relatively large number of erasures for a majority of flash memories in a system but to provide for a relatively lower number of permissible erasures in certain devices (in order to provide for a higher level or confidence in the reliability of such devices e.g. for mission-critical uses). Other types of information may be provided as initial REL information, either in addition to or in place of a maximum number of permissible erasures, either during manufacturer 314 or installation/configuration 316, including storing a serial number or similar identifier 318 storing a date of manufacture 320 storing a universal resource locator (URL) 324 (e.g. for embodiments in which approaching expected end of lifetime triggers the sending of a message to a remote site 118a, 118b, 118c) and/or storing a date of installation or configuration 326.

In the depicted embodiment, a number of comparisons or tests against the value of the counter are performed during boot-up 328 of the computer or system in which the flash memory is located. In other embodiments, rather than performing the comparisons only during each boot-up, the comparisons can be performed in other fashions such as periodically (once a day, once an hour, etc.) and preferably in a fashion which is configurable by a user, system administrator and the like. Preferably the comparisons or tests are performed by logic circuitry which is positioned on the flash memory 226. Those of skill in the art will understand, after reading the present disclosure, how to design and provide logic circuitry which performs the tests and other functions depicted in FIG. 3 and described generally herein.

In the embodiment depicted in FIG. 3, a comparison is performed to determine whether the value currently in the counter is less than a warning threshold. The warning threshold may be a value which is stored or hardwired by the manufacturer or may be a value which can be stored, set or modified by the user or system administrator.

As the value of the header counter is decremented and approaches a zero value, when the value falls below the warning threshold 332, the REL logic 226 will cause the flash memory to output an interrupt 216c to which the computer 126 responds by outputting a warning 334 or taking other appropriate action, examples of which are provided herein.

The value to be used for the warning threshold will depend upon a number of factors such as the expected frequency of flash memory erasures and the expected frequency with which the comparison 322 will be performed. For example, if it is expected that about 50 flash memory erasures may occur per day and if boot-up 28 is expected to occur once per day, preferably the warning threshold would be greater than 50 so that, on average, a user would receive a warning at least one day before the expected-end-of-lifetime event for the flash memory.

As depicted in FIG. 3, it is possible to provide for other tests or comparisons (in addition to or in place of the tests relating to the maximum number of permissible erasures) such as testing whether the age of the flash memory, since its manufacturer, exceeds a first age threshold 336. It is also possible to, e.g., determine whether the age of the flash memory since its installation exceeds second age threshold 338. As described generally above, it is also possible to provide embodiments in which a disablement threshold is provided, such that, if the header counter exceeds a disablement threshold 340 (which may be, e.g., zero) the data storage unit is disabled 342, such as by causing the CPU to refuse to provide any control signals to the flash memory 212.

After the boot-up 328 and preferably regardless of the outcome of the boot-up tests 332, 336, 338, 340, certain operations of the flash memory 212 are monitored during use 344. For example, in the depicted embodiment, in which the header counter is intended to maintain an indication of the number of permissible erasures remaining, the REL logic 226 will monitor 234 erase signals or commands 216f, preferably looping continuously 346 until an erasure operation is detected 348, in which case the header counter 232 will be decremented 352 before looping back 346 to continue monitoring. In this fashion, every time there is an erasure operation, the header counter will be decremented and thus the header counter will retain the maximum number of permissible erasures remaining for the flash memory 212.

Figure 4:
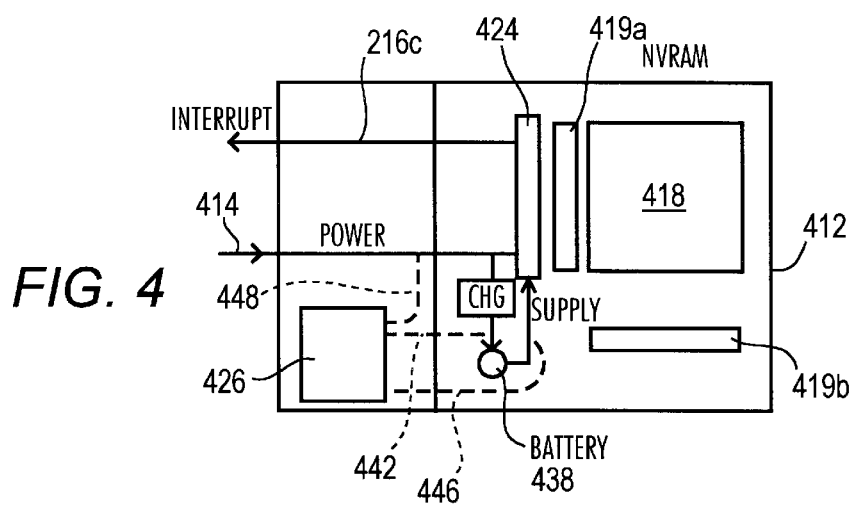
FIG. 4 is a block diagram of a non-volatile RAM device according to the embodiment of the present inventions.

FIG. 4 depicts an embodiment in which REL information is stored on a nonvolatile NVRAM 412. In the depicted embodiment, the nonvolatile RAM includes a main memory area 418 row and column address decoders, sense amps and the like 419a 419b. Read/write and control logic 424 and one or more batteries 438, typically a lithium battery, to power the refresh cycles needed to maintain contents of main memory 418 when the NVRAM is not receiving power 414. For purposes of illustration, in a configuration in which the battery 438 can be expected to have a lifetime related to the number of charge/discharge cycles, the NVRAM will be provided with REL logic 426 which includes a counter which is initialized to the maximum number of expected charge/discharge cycles. The REL logic 426 can be configured to monitor occurrences of charge/discharge cycles e.g. by monitoring the battery charge line 442, a discharge or battery supply line 446, and/or monitoring 448 the power line 414. In use, the REL logic 426 will decrement the charge/discharge counter during each discharge cycle and, when the counter falls below a warning threshold, will output an interrupt signal which can be used in a number of fashions, such as outputting a warning to the user, contacting a system administrator computer or other remote site and the like. Preferably, the counter can be reset to a maximum number of expected charge/discharge cycles when the battery is replaced.

Figure 5:
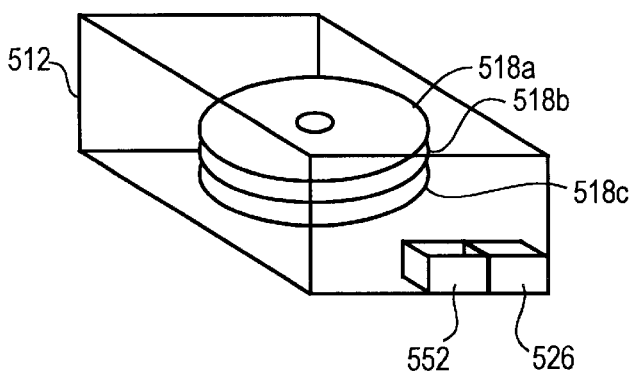
FIG. 5 is a schematic block diagram of a hard disk drive according to an embodiment of the present invention.

Although, as described above, it is desired to store at least some of the REL information in a fashion which moves with the data storage unit, it is possible to store some or all of the REL information in a storage device different from the main storage media of the data storage unit. For example, as illustrated in FIG. 5, where the data storage unit is a disk drive 512, although it is possible to store some or all REL information on the disks 518a, b, c, the embodiment of FIG. 5 provides for non-volatile memory (NVROM) such as flash memory 552 or battery-backed-up memory, coupled to REL control logic 526, for storing REL information. If desired, the disks 518a, b, c can be used to store REL information relating to the NVROM (such as remaining charge/discharge cycles). In this way a medium or device other than that which is being protected by the storage of REL information is used to store the REL information. The manner of using the embodiment of FIG. 5 is generally analogous to that described above for the examples of FIGS. 2 and 4. In general, if the expected lifetime of the disk drive 512 is based on the number of hours in service, the flash memory 552 may include a counter which is initialized to the total number of service hours expected and the REL logic 526 is configured to decrement the counter once per hour, during use, and to output an interrupt signal when the value of the counter falls below one or more thresholds. If desired, it is possible to use the flash memory 552 to store other information, i.e. information in addition to or in place of any or all REL information, such as storing a copy of FAT tables, super block information, ECC (error correction code) information and the like (in duplicate form, in distribution form, or in exclusive form) in the flash memory 552 such that, in case of a head crash or other failure, information in the flash memory 552 may be used to recover some or all of the data stored on the disk 518*a, b, c*.

Figure 6:
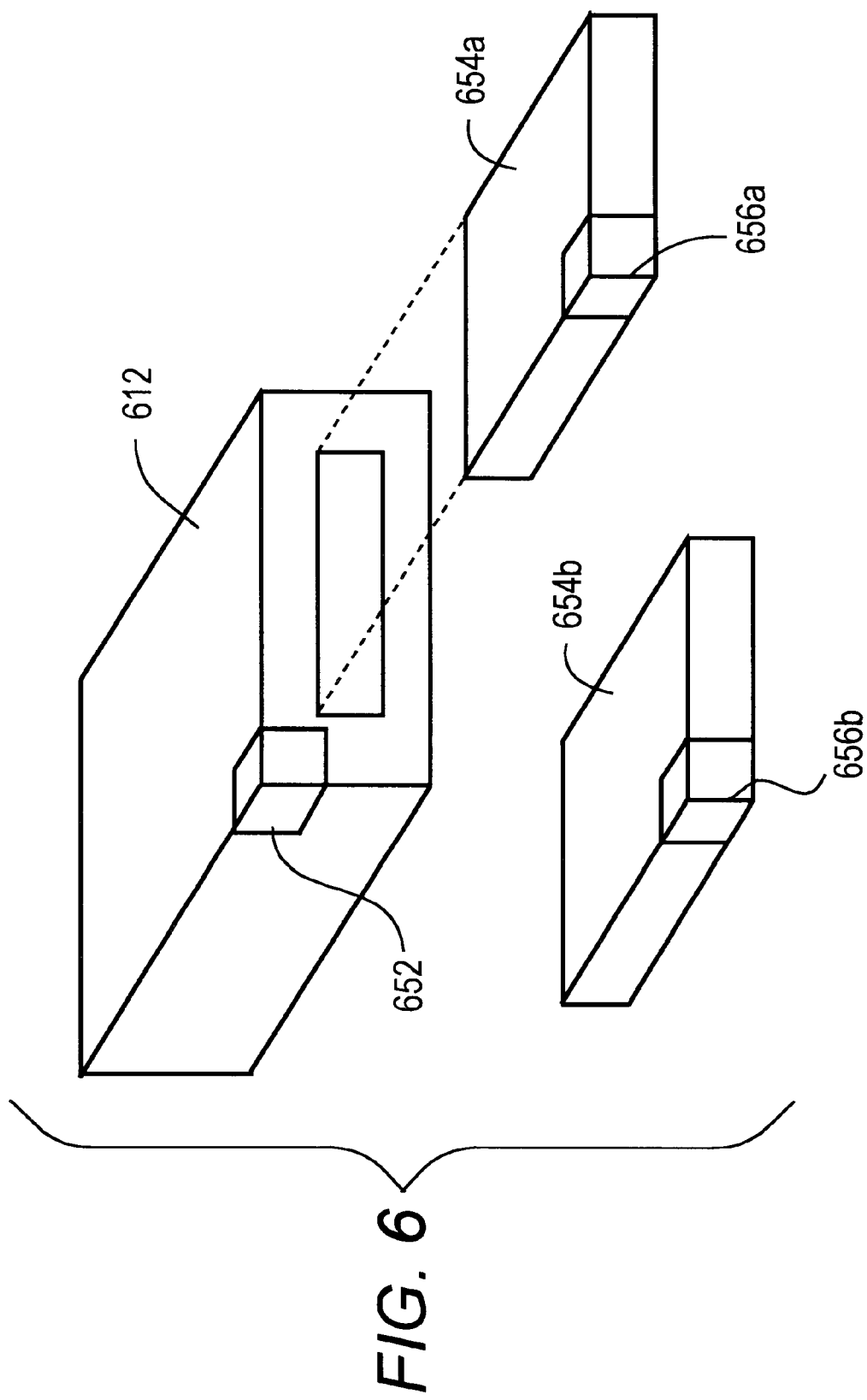
FIG. 6 is a block diagram of a removable medium hard disk drive according to a embodiment of the present invention.

As noted above, it is generally desired to provide for storage of at least some REL information in a fashion which moves with the device to which the REL information pertains. For example, in the embodiment of FIG. 6, a drive device for a removable medium hard disk drive (RMHDD) is provided with flash memory or other storage device 625 for storing REL information related to the expected lifetime of the drive 612. Thus, even when the removable media packs 654*a* 654*b* are removed or inserted into the RMHDD 612, expected lifetime information pertinent to the drive 612 is maintained. In one embodiment, the media packs 654*a, b* each contain their own flash memory or other information storage devices 656*a, b* for storing REL information pertinent to the removable media packs.

A given piece of hardware thus might have numerous pieces of REL information stored. For example, for a given hard drive, there could be storage of information relating to drive motor lifetime, head wear, battery lifetime, and so forth. When a system administrator or other central figure is responsible for taking appropriate actions as end-of-lifetime events approach, it would be useful to provide an option for the system administrator to be able to review all REL information available in the system (or selectable portions thereof), substantially all at one time or place, such as providing for storage of current, system-wide REL information in a central database (updated continuously, or on demand, in a push or pull manner). Preferably, as new components or hardware are added to the system, the system queries to components to identify the type of REL information that is available on that hardware or component.

In light of the above description, a number of advantages of the present invention can be seen. The present invention permits reliable information regarding expected lifetime of a device to be used (e.g. for outputting warnings or taking actions) even when data storage units are moved from one computer or other device to another. The present invention provides the opportunity for end users, system administrators, technical support personnel and the like to take appropriate action, such as replacing or maintaining components, as components approach the end of their expected lifetimes. The present invention provides manufacturers, vendors and others the opportunity to offer replacement and/or upgrade components to users at or near the time that users would typically need to perform such upgrades. The present invention appears to be particularly advantageous in connection with data storage units which have relatively well-defined expected lifetime and/or data storage units which are not uncommonly removed, replaced or moved from one machine to another.

A number of variations and modifications of the present invention can be used. It is possible to use some aspects of the invention without using others, such as providing for storage of REL information which moves with a data storage unit without providing for warnings to end users. In some situations, it may be desirable to configure one or more computers 116 with multiple data storage units 112 such that, in response to the detection of an impending end-of-design-life event for one data storage unit 112, the computer will automatically (i.e. without the need for human decision or manipulation) copy data from a data storage unit 112 such as a first flash memory which is approaching its design lifetime limit to another, substantially unused data storage unit (or a data storage unit with substantial remaining lifetime), such as a second flash memory preferably in a manner substantially transparent to the user. Although providing the REL logic 226 on the flash memory 212 is useful in avoiding imposing additional computing or programming burden on the CPU and/or programmers, it is possible to configure an operable system in which some or all of the REL functions described herein, including some or all of the comparison or test functions, such as those depicted in FIG. 3, are implemented using software and/or are performed by the CPU 126. In one embodiment, once a maximum number of writes has been performed, information can be written to a PAL device, e.g. so as to disable further writes (until the PAL is re-programmed). Although examples of items with limited duration or number of uses have been given other items can benefit from the present invention, including, for example, magnetic tapes and tape drives, devices with a limited number of insertions, backplanes and insertion handles (e.g. having a limited number of mating cycles), writable disks, re-writable disks, DVD RAMs, and the like.

The present invention, in various embodiments, includes components, methods, processes, systems and/or apparatus substantially as depicted and described herein, including various embodiments, subcombinations, and subsets thereof. Those of skill in the art will understand how to make and use the present invention after understanding the present disclosure. The present invention, in various embodiments, includes providing devices and processes in the absence of items not depicted and/or described herein or in various embodiments hereof, including in the absence of such items as may have been used in previous devices or processes, e.g. for improving performance, achieving ease and/or reducing cost of implementation.

The foregoing discussion of the invention has been presented for purposes of illustration and description. The foregoing is not intended to limit the invention to the form or forms disclosed herein. Although the description of the invention has included description of one or more embodiments and certain variations and modifications, other variations and modifications are within the scope of the invention, e.g. as may be within the skill and knowledge of those in the art, after understanding the present disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. Apparatus for a data storage unit having at least a main data storage medium for storing data, comprising:

an electronic data storage device, comprising a header portion of said main data storage medium, which stores at least first remaining-expected-lifetime (REL) information usable for determining remaining expected lifetime of said data storage unit, said electronic data storage device being physically coupled to said data storage unit;

at least a first output line for outputting at least a first signal related to the remaining-expected-lifetime of said data storage unit.

2. Apparatus, as claimed in claim 1, wherein said data storage unit is selected from the group consisting of:

flash memory;

non-volatile RAM;

a tape drive;

a re-writable disk;

a hard disk drive; and a removable media hard disk drive.

3. Apparatus, as claimed in claim 1 wherein said electronic data storage device is separate from said main data storage medium.

4. Apparatus, as claimed in claim 1 wherein said REL information is updated in response to usage of said data storage unit.

5. Apparatus, as claimed in claim 4, further comprising logic circuitry, physically coupled to said data storage unit, which updates said REL information.

6. A method for use with a data storage unit having at least a main data storage medium for storing data, comprising:

providing an electronic data storage device different from said main data storage medium, said electronic data storage device being physically coupled to said data storage unit;

storing system information in said electronic data storage device;

outputting said system information from said data storage device;

wherein said system information includes at least first remaining-expected-lifetime (REL) information usable for determining remaining expected lifetime of said data storage unit and wherein said step of outputting includes outputting, from said data storage unit, at least a first signal related to the remaining-expected-lifetime of said data storage unit;

displaying a warning of impending end of lifetime of said data storage unit, in response to said outputting of said first signal.

7. A method, as claimed in claim 6 further comprising updating said REL information in response to usage of said data storage unit.

8. A method, as claimed in claim 6, further comprising sending, to a remote computer, a message indicating impending end of lifetime of said data storage unit, in response to said outputting of said first signal.

9. A method, as claimed in claim 6, further comprising disabling said data storage unit in response to said outputting of said first signal.

10. A method, as claimed in claim 6, wherein said data storage unit is a hard disk drive, and further comprising storing superblock information relating to said hard disk drive on said electronic data storage device.

11. Apparatus for a data storage unit having at least a main data storage medium for storing data, comprising:

electronic means, comprising a header portion of said main data storage medium for storing at least first remaining-expected-lifetime (REL) information usable for determining remaining expected lifetime of said data storage unit, said electronic means for storing being physically coupled to said data storage unit;

means for outputting at least a first signal related to the remaining-expected-lifetime of said data storage unit.

12. Apparatus, as claimed in claim 11, wherein said electronic means for storing comprises a portion of said main data storage medium.

13. Apparatus, as claimed in claim 11 wherein said electronic means for storing is separate from said main data storage medium.

14. Apparatus, as claimed in claim 11 further comprising means for updating said REL information in response to usage of said data storage unit.

15. Apparatus, as claimed in claim 14, wherein said means for updating is physically coupled to said data storage unit.

16. Apparatus as claimed in claim 11, wherein said data storage unit comprises a flash memory, said header region including at least a first counter initialized to a first value, further comprising:

read/write circuitry configured to read and write from and to said main memory; and logic circuitry configured to monitor erase operations performed on said flash memory and, in response, decrement said counter.

17. Apparatus as claimed in claim 16, wherein said logic circuitry is further configured to output, from said flash memory, at least a first signal when said counter stores a value which is less than at least a first threshold value.

18. A non-volatile RAM comprising:

a main memory for storing data, said main memory including a header region, said header region including at least a first counter initialized to a first value;

a battery for providing power for refresh operations when external power is unavailable;

read/write circuitry configured to read and write from and to said main memory;

logic circuitry configured to monitor charges of said battery and, in response, incrementing said counter.

19. A non-volatile RAM, as claimed in claim 18, wherein said logic circuitry is further configured to output, from said non-volatile RAM, at least a first signal when said counter stores a value which is greater than at least a first threshold value.

* * * * *